United States Patent [19]

Burwasser

[11] 4,241,134
[45] Dec. 23, 1980

[54] ELECTROSTATICALLY IMAGEABLE DRAFTING FILM

[75] Inventor: Herman Burwasser, Boonton, N.J.

[73] Assignee: GAF Corporation, New York, N.Y.

[21] Appl. No.: 42,146

[22] Filed: May 24, 1979

Related U.S. Application Data

[63] Continuation of Ser. No. 902,913, May 5, 1978, abandoned.

[51] Int. Cl.³ ................. B32B 5/16; B32B 19/02
[52] U.S. Cl. ................. 428/331; 346/135.1; 346/153; 427/121; 428/336; 428/339; 428/404; 428/458
[58] Field of Search ........... 96/1.5 R, 1.5 N, 87 A; 204/2; 346/135, 153, 135.1; 427/121; 428/331, 336, 339, 458, 511–514, 323, 404, 500

[56] References Cited

U.S. PATENT DOCUMENTS

| | | | |
|---|---|---|---|
| 3,132,584 | 5/1964 | Dalton | 204/2 |
| 3,212,931 | 10/1965 | Kubota et al. | 204/2 |
| 3,283,704 | 11/1966 | Dalton | 204/2 |
| 3,484,237 | 12/1969 | Shattuck et al. | 96/1.5 |
| 3,639,640 | 2/1972 | Gager | 428/248 |
| 3,684,746 | 8/1972 | Juna et al. | 204/2 |
| 3,784,398 | 1/1974 | Metcalfe et al. | 96/1.4 |
| 3,857,729 | 12/1974 | Burwasser | 96/87 A |
| 3,928,697 | 12/1975 | Mallinson et al. | 428/142 |
| 3,991,253 | 11/1976 | Markhart et al. | 428/328 |
| 4,133,933 | 1/1979 | Sekine et al. | 428/331 |
| 4,139,675 | 2/1979 | Nagai et al. | 428/331 |

*Primary Examiner*—Bruce H. Hess
*Attorney, Agent, or Firm*—Walter C. Kehm; James Magee, Jr.

[57] ABSTRACT

Electrostatically imageable drafting film which comprises a plastic, impermeable, non-conductive, actinically transparent film support coated first with a conductive layer which is then overcoated by a dielectric composition comprising a suitable toothing pigment and a binder resin.

2 Claims, No Drawings

ELECTROSTATICALLY IMAGEABLE DRAFTING FILM

RELATED APPLICATIONS

This application is a continuation in part of application Ser. No. 902,913 filed May 5, 1978, now abandoned.

BACKGROUND OF THE INVENTION

The present invention relates to actinically transparent drafting films which have been provided with a combination of layers which permit imaging by transfer of electrostatic charges in addition to the reception of conventional indicia by drafting tools using as marking materials ink, pencil, crayon and the like. The advantages of drafting films which can have information supplied both by electrostatic means and conventional means are obvious.

Many instances of diazo imaging systems in combination with conventional indicia receiving layers are known. These systems have the advantage of providing copies of information relatively easily, but do not permit the addition of further information by diazo means, since development of the diazo system prevents its further use for photographic imaging.

DESCRIPTION OF THE PRIOR ART

Drafting films comprising a suitable support and carrying an indicia receiving layer of toothing pigment such as finely divided crystalline silica, powdered glass, amorphous or diatomaceous silica in a suitable binder are well known. A preferred size range for these toothing materials is about 2-6 microns. Examples of several such drafting films are described in U.S. Pat. No. 3,857,729. The drafting films described therein are not capable of imaging in any electrostatic or electrophotographic copiers.

Electrostatographic recording elements are described in U.S. Pat. No. 3,639,640 which comprise conductive bases or supports over which is coated a dielectric layer which includes lithopone pigment which improves the markability of the surface of these elements. Difficulty arising from the use of a conductive base support is the control of the degree of saturation of the support when its conductivity is provided by treating it with solutions of inorganic salts or electrically conductive polymers. This patent describes use of porous substrates and consequently the production of conductive substrate is accomplished by "soak in processes." This problem is further aggravated when a dielectric layer is applied over the first conductive layer since evenness of coating thickness will depend in large part on how much of the first coat has been imbibed into the base support.

SUMMARY OF THE INVENTION

The present invention relates to an actinically transparent electrostatically imageable drafting film which is differently made than any drafting film described in the prior art. The drafting film of this invention includes a dielectric base or support layer, a conductive layer, and a markable dielectric surface layer coated on the surface of the conductive layer. This construction provides an electrostatic imageable element having a conductive layer positioned between two dielectric layers, the upper of which is provided with a particulate toothing material which renders the dielectric surface susceptable to conventional marking methods while at the same time not interfering with either the dielectric character of the surface or the actinic transparency of the composite element.

DESCRIPTION OF THE PREFERRED EMBODIMENTS

Any actinically transparent film base support having the requisite physical characteristics generally described hereinbefore is suitable for use in the present invention. The preferred supports which have been found particularly suited to the present invention are heat-set, biaxially-oriented linear polyesters such as terephthalic acid ethylene glycol esters sold under the trademarks "Mylar," "Melinex" or "Celanar." The films used as supports generally are from about 75 to 175 microns thick. They are strong, durable, non-conductive and in the sense of this invention impermeable to coating compositions applied to it.

The conductive layer which is positioned between the support layer and the markable dielectric surface layer may be any of those conductive materials or polymers well known to the art of electrostatic imaging. The use of carbon black or the usual inorganic salt compounds is possible in some instances, but the preferred conductive materials are conductive polymers such as sulfonated polystyrene, quaternized polymers of vinyl pyridine with aliphatic esters, polymers of polyacrylic acid salts and the like. Other suitable conductive coated supports are those commercially available from the Sierracin Corporation, under the tradenames Sierracin A and Sierracin B which are coated with a conductive layer of indium oxide doped with tin.

The conductive layers provided using the materials and polymers described above have resistivity values less than $10^{10}$ ohms/square at 50% relative humidity and preferably less than $10^8$ ohms/square.

It will be understood that the conductive coating applied to the support adheres well to the support. It retains a uniform independent integrity being continuous and of generally uniform thickness.

The markable dielectric drafting-surface composition applied on top of the conductive layer comprises a resin binder which is itself dielectric in character and which contains homogeneously dispersed therein a toothing pigment which makes the dielectric surface operative as a drafting surface markable by ink, pencil, crayon and the like, without diminishing the electrostatic image receiving ability of the element. Resins which may be used in the dielectric layer include polyvinyl acetates, acrylics, styrenated acrylics, polyesters, polyvinyl butyrals, polycarbonates and the like. The term markable, as used herein including the appended claims, refers to the ability to receive and retain indicia by conventional drafting means such as pen and ink, pencil, paint, crayon, and the like.

Many toothing compounds are known from the art for preparing indicia receiving surfaces. The choice in the present invention is, however, restricted to those which do not alter the desired dielectric properties of the surface detrimentally, i.e. caused a lowering of the dielectrics insulating characteristics, and those which retain do not impair actinic transparency of the film, since one of the ultimate use of copies made on the drafting film of the invention is as a mask for diazo reproduction. The preferred toothing compounds of the present invention are silica in various forms which do not impair the dielectric qualities of the resins recited above. The preferred silicas include finely powdered crystalline silica, amorphous or diatomacious silica and fumed silica. A preferred particle size in the present invention is from about 2 to 6 microns.

The following examples are given by way of illustration and not by way of limitation.

The conductive resins described in examples I, II and III were coated on a terephthalic acid polyester of ethylene glycol, "Celanar" made by the Celanese Corporation. The film support was about 76 micrometers thick.

| | Examples | |
|---|---|---|
| I | II | III |
| Sulfonated Polystyrene 50g | Polyvinyl benzyl trimethyl ammonium chloride 50g | Poly 2-acrylamide N-methylol trimethyl ammonium chloride 50g |
| Water 50ml | Methanol 50ml | Water 50ml |
| Duponol G 3 drops | — | — |

The compositions were applied to their respective polyester supports using a #10 wire wound bar. Any suitable coating technique is usable as will be apparent to those skilled in the art. Once the coating attains the required conductivity the thickness thereof is not critical and is dictated by practical considerations.

A composition which will serve as both a dielectric surface layer and which will include in said layer a toothing compound to provide a drafting surface was prepared as follows:

Methyl isobutyl ketone 90.0 g and toluene 60.0 were placed in a beaker which contained a stirrer rod and placed on a magnetic stirrer. The solvent solution was stirred while 12.5 g of cellulose acetate propionate and 14.0 g of powdered crystalline silica (2–6μ) were added. The composition was stirred for twenty minutes. It was transferred to a Waring blender and agitated for two minutes. The composition then had a viscosity of 52 cps.

Six coatings were made using the dielectric drafting surface composition. The three conductively coated films of Examples I, II and III, with IV and V which are film supports with a conductive layer of indium oxide doped with tin and VI a film support without a conductive layer. The six supports were coated with the dielectric resin containing toothing compounds using a #16 wire wound bar. The coatings were dried in an oven at 95° C. for about 35 minutes. The electrostatically imageable drafting films were kept at ambient temperature and 50% relative humidity for about a half hour.

Several thicknesses of dielectric layers were prepared. This permitted correlation of developed image density to dielectric drafting surface composition layer thickness. Satisfactory results were obtained with layers ranging from 1.4 to 14.2 microns. The preferred thickness was from 1.4 to 10 microns while maximum density was obtained at a thickness of about 4–5 microns.

The drafting films were then imaged in a Minolta 101 copier. The resolution obtained for the drafting films was satisfactory for copies obtained using films I–V. These also copied with acceptable density. Film VI not having a conductive layer did not image.

What is claimed is:

1. An actinically transparent electrostatically imageable drafting film consisting essentially of a nonconductive plastic film support, an electrically conductive layer coated on one side of said support and, coated on said conductive layer, a markable dielectric layer comprising a dielectric binder resin and a particulate silica toothing material uniformly dispersed therein, said dielectric binder resin being selected from the group consisting of styrenated acrylics and cellulosic film formers, said toothing material having an average particle size from 2–6 microns and being dispersed in the binder in a weight ratio of about 1:1, said dielectric layer being from 1.4 to 10 microns thick.

2. The actinically transparent electrostatically imageable drafting film of claim 1 consisting essentially of a polyethylene terephthate ester support, a conductive layer of tin doped indium oxide and a dielectric layer comprising particulate silica having a particle size of from 2–6 microns dispersed in cellulose acetate propionate binder in weight ratio of about 14 grams of silica to 12.5 grams of binder, the dielectric layer being from 1.4 to 10 microns thick.

* * * * *